United States Patent
Senda et al.

(10) Patent No.: US 8,999,864 B2
(45) Date of Patent: Apr. 7, 2015

(54) SILICON WAFER AND METHOD FOR HEAT-TREATING SILICON WAFER

(75) Inventors: Takeshi Senda, Niigata (JP); Hiromichi Isogai, Niigata (JP); Eiji Toyoda, Niigata (JP); Koji Araki, Niigata (JP); Tatsuhiko Aoki, Niigata (JP); Haruo Sudo, Niigata (JP); Koji Izunome, Niigata (JP); Susumu Maeda, Hadano (JP); Kazuhiko Kashima, Hadano (JP); Hiroyuki Saito, Niigata (JP)

(73) Assignee: Global Wafers Japan Co., Ltd., Niigata (JP)

( * ) Notice: Subject to any disclaimer, the term of this patent is extended or adjusted under 35 U.S.C. 154(b) by 420 days.

(21) Appl. No.: 13/322,080

(22) PCT Filed: May 28, 2010

(86) PCT No.: PCT/JP2010/003583
§ 371 (c)(1),
(2), (4) Date: Feb. 16, 2012

(87) PCT Pub. No.: WO2010/140323
PCT Pub. Date: Dec. 9, 2010

(65) Prior Publication Data
US 2012/0139088 A1   Jun. 7, 2012

(30) Foreign Application Priority Data

Jun. 3, 2009 (JP) ................. 2009-134252
Jun. 29, 2009 (JP) ................. 2009-153776
Jul. 31, 2009 (JP) ................. 2009-179319

(51) Int. Cl.
*H01L 21/26* (2006.01)
*H01L 21/00* (2006.01)
*H01L 21/322* (2006.01)

(52) U.S. Cl.
CPC ......... *H01L 21/3225* (2013.01); *Y10S 438/928* (2013.01)

(58) Field of Classification Search
CPC ............ H01L 21/3225; H01L 21/3221; H01L 21/02238; H01L 21/0255; H01L 21/31622; H01L 21/3242
USPC ........................... 438/58, 310, 477, 795, 928; 257/E21.321, E21.324
See application file for complete search history.

(56) References Cited

U.S. PATENT DOCUMENTS 5,360,769 A * 11/1994 Thakur et al. ............... 438/762
5,534,294 A * 7/1996 Kubota et al. ............... 438/476

(Continued)

FOREIGN PATENT DOCUMENTS

JP       08-330316 A    12/1996

(Continued)

OTHER PUBLICATIONS

International Search Report (PCT/ISA/210) issued on Jun. 29, 2010, by Japanese Patent Office as the International Searching Authority for International Application No. PCT/JP2010/003583.

*Primary Examiner* — Nitin Parekh
(74) *Attorney, Agent, or Firm* — Buchanan, Ingersoll & Rooney PC

(57) ABSTRACT

A silicon wafer for preventing a void defect in a bulk region from becoming source of contamination and slip generation in a device process is provided. And a heat-treating method thereof for reducing crystal defects such as COP in a region near the wafer surface to be a device active region is provided. The silicon wafer has a surface region 1 which is a defect-free region and a bulk region 2 including void defect of a polyhedron whose basic shape is an octahedron in which a corner portion of the polyhedron is in the curved shape and an inner-wall oxide film the void defect is removed. The silicon wafer is provided by performing a heat-treating method in which gas to be supplied, inner pressure of spaces and a maximum achievable temperature are set to a predetermined value when subjecting the silicon wafer produced by a CZ method to RTP.

4 Claims, 5 Drawing Sheets

(56) References Cited

U.S. PATENT DOCUMENTS

| | | | |
|---|---|---|---|
| 5,954,873 A | 9/1999 | Hourai et al. | |
| 6,436,846 B1 | 8/2002 | Tews et al. | |
| 7,135,351 B2 * | 11/2006 | Binns et al. | 438/58 |
| 7,537,657 B2 * | 5/2009 | Seuring et al. | 117/13 |
| 8,382,894 B2 * | 2/2013 | Nakai et al. | 117/3 |
| 2003/0148634 A1 | 8/2003 | Holzl et al. | |
| 2005/0005841 A1 | 1/2005 | Falster et al. | |
| 2006/0189169 A1 * | 8/2006 | Adachi et al. | 438/795 |

FOREIGN PATENT DOCUMENTS

| | | |
|---|---|---|
| JP | 2000-091259 A | 3/2000 |
| JP | 2001-308101 A | 11/2001 |
| JP | 2002-075896 A | 3/2002 |
| JP | 2002-110684 A | 4/2002 |
| JP | 2003-077851 A | 3/2003 |
| JP | 2003-297840 A | 10/2003 |
| JP | 2005-123241 A | 5/2005 |
| JP | 2005-522879 A | 7/2005 |
| JP | 2006-004983 A | 1/2006 |
| JP | 2007-534579 | 11/2007 |
| WO | WO 03/088346 A1 | 10/2003 |
| WO | WO 2005/007942 A1 | 1/2005 |

* cited by examiner

SILICON WAFER AND METHOD FOR HEAT-TREATING SILICON WAFER

TECHNICAL FIELD

The present invention relates to a silicon wafer (hereinafter simply referred to as a wafer) to be preferably used as a substrate for forming a semiconductor device and a method for heat-treating a silicon wafer which performs a heat treatment on a silicon wafer obtained by slicing a silicon single crystal ingot grown by a Czochralski method (hereinafter referred to as a CZ method).

BACKGROUND ART

With trends toward high integration of semiconductor devices and micro-miniaturization of a design rule in recent years, for a silicon wafer to be used as a substrate thereof, it is required that no void defects such as Crystal Originated Particle (COP) are present in a region near the wafer surface to be a device active region (specially from the wafer surface to a depth of 5 μm, hereinafter also referred to as a surface region).

Generally, a silicon wafer made by slicing a silicon single crystal ingot grown by a CZ method and then mirror polishing has void defects such as COP therein. The void defects such as COP in the device active region can be eliminated, for example, by subjecting the silicon wafer to heat treatment at a temperature of 1100° C. or higher in an Ar gas atmosphere for 30 minutes or longer by use of a vertical type heat-treatment apparatus or the like (for example, Patent Document 1).

Also, such a silicon wafer having no void defects can be produced, for example by controlling V/G (V indicates a pulling rate and G indicates a temperature gradient) when growing the silicon single crystal ingot in the CZ method, pulling up the silicon single crystal ingot entirely having a defect-free region and then slicing the ingot (For example, Patent Document 2).

However, in the method described in Patent Document 2, the void defects can be generated by a slight variation in V/G and it is very difficult to control it. In addition, in the case of pulling up the defect-free region by controlling V/G, generally, the pulling rate V is required to be lowered and thus productivity in growing the silicon single crystal becomes lower.

For these reasons, a method for forming a defect free layer in the wafer surface region where the device is formed is proposed (for example in Patent Document 3). The method includes growing a silicon single crystal ingot having a region where vacancy type point defects predominate (hereinafter referred to as V-rich region) so that the pulling rate V can be raised; subjecting a silicon wafer obtained by slicing the single crystal ingot to an HF treatment and thereby removing an inner-wall oxide film of a void defect present in the wafer surface region; and then subjecting the silicon wafer to a rapid heating/cooling thermal process (hereinafter also referred to as RTP).

On the other hand, a silicon wafer having highly dense BMD (Bulk Micro Defect) in a region deeper than the wafer surface region (specially, a region deeper than 5 μm from the wafer surface, hereinafter referred to as a wafer bulk region) has a gettering effect for metal impurities or the like incorporated during a device process.

In this respect, for example, a method of performing RTP in a nitrogen or inert atmosphere and controlling the cooling rate, thereby allowing excess vacancies to remain in the wafer bulk region and forming oxygen precipitate nuclei is proposed (For example, Patent Documents 4 and 5).

Further, a method of forming a thermal oxide film having a thickness that is preselected to correspond to a preselected depth of defect-free region in an oxidation atmosphere when performing RTP (for example, Patent Document 6) and a method of performing RTP by supplying an argon-based gas to the silicon wafer surface side and a nitrogen-based gas to the back surface side (for example, Patent Document 7) are known.

As an apparatus for performing such RTP, for example, such apparatus that includes a chamber for accommodating a substrate; a substrate support member arranged in the chamber and having a ring frame for supporting the edge portion of the substrate; a heating portion for heating the substrate; and a modifying gas supplying portion for supplying a modifying gas including a first gas containing an oxide atom in the molecule and a second gas as a dilution gas into a substantially closed space formed on a back surface side of a substrate surface where a semiconductor device is formed, is effective (for example, Patent Document 8).

CITATION LIST

Patent Literature

Patent Literature 1: Japanese Patent Application Laid-Open (kokai) No. 2006-4983

Patent Literature 2: Japanese Patent Application Laid-Open (kokai) No. H8-330316

Patent Literature 3: Japanese Patent Application Laid-Open (kokai) No. 2005-123241

Patent Literature 4: Japanese Patent Application Laid-Open (kohyo) No. 2007-534579

Patent literature 5: Japanese Patent Application Laid-Open (kohyo) No. 2005-522879

Patent Literature 6: Japanese Patent Application Laid-Open (kokai) No. 2000-91259

Patent Literature 7: Japanese Patent Application Laid-Open (kokai) No. 2001-308101

Patent Literature 8: Japanese Patent Application Laid-Open (kokai) No. 2003-77851

DISCLOSURE OF THE INVENTION

Problems to be Solved by the Invention

However, according to the heat treatment method described in Patent Document 1, productivity decreases due to a heat treatment for a long time. Also, since the long-time heat treatment causes out-diffusion of oxygen from the wafer surface and great reduction of a concentration of solid-solution oxygen in the device active region, it is difficult to inhibit elongation of dislocation generated by application of damage or strain produced in the device process.

Further, according to the above-mentioned method described in Patent Document 3, although the defect free layer can be formed in the wafer surface region to be the device active region, elimination of the void defects or the like in the wafer bulk region deeper than the above-mentioned wafer surface region is not described or considered at all.

Furthermore, according to the methods of Patent Documents 4 and 5, although uniformity in formation of oxygen precipitate nuclei in the wafer bulk region can be achieved, elimination of the void defect or the like in the wafer bulk region is not described or considered at all in the above-mentioned Patent Documents 4 and 5.

As shown in FIG. 6, the void defect generally has a shape of a polyhedron whose basic shape is an octahedron and there is an inner-wall oxide film inside of the void defect. In the case where there are many void defects in the wafer bulk region, there is a possibility that the void defect itself becomes a contamination source in the device process.

In addition, since the void defect has a shape of an octahedron, slip can easily be generated by strains concentrated on its sharp corner portion 3.

As described in Patent Documents 4 and 5, BMD may densely be formed in the wafer bulk region so as to prevent the above-mentioned void defect from becoming contamination source. However, in order to form BMD, certain conditions such as having many vacancies in the wafer bulk region and having a high oxygen concentration are needed. Thus, there are limitations on the production. In addition, in the case where the BMD is densely formed, the BMD may become a source of slip generation. Thus, it is not preferred.

Further, according to the heat treatment method described in Patent Document 6, since oxygen in the atmosphere is in-diffused into the wafer surface, concentration of solid-solution oxygen in an outermost wafer surface portion of the device active region is increased. In this outermost wafer surface portion, the void defect may remain without being eliminated because of poor solubility of the inner-wall oxide film of the void defect. In this case, mirror polishing needs to be performed again after performing RTP so as to remove the outermost wafer surface portion, and thus there is a problem of decrease in the productivity.

By contrast, since the argon-based gas is used in the heat treatment method as described in Patent Document 7, the concentration of solid-solution oxygen in the outermost wafer surface portion of the device active region is not increased. In this case, since the inner-wall oxide film of the void defect is more soluble, it is possible to eliminate the void defects in the outermost wafer surface portion. However, where interstitial Si (hereinafter referred to as i-Si) is necessary to eliminate the void defect having a dissolved inner-wall oxide film, the amount of generated i-Si is small in the argon gas compared with the oxygen atmosphere. Therefore, an area capable of eliminating the void defect by RTP which is a short-time heat treatment in the order of seconds may be limited only to the outermost wafer surface portion of the device active region. Thus, an ability of eliminating the void defect may be reduced and the void defect may remain without being eliminated in the device active region lower than the outermost surface portion (hereinafter, referred to as surface layer portion). In this case, there is a problem that the yield is decreased in the device process.

It is to be noted that in the case of using the RTP apparatus as described in Patent Document 8, the outer periphery of the backside of the silicon wafer (within about 1 to 2 mm from the outer edge of the wafer) is supported on a susceptor for example made of SiC such that the supported portion is shaped like a ring. In this case, the center part of the supported wafer is warped into a bowl shape and elastically deformed by influence of gravity and thermal expansion during RTP (FIG. 11). In such a case, a self-weight stress of the wafer is concentrated on the inner peripheral edge portion 7a of the ring-shaped susceptor 7 for supporting the outer periphery of the backside of the wafer W, and it causes a problem that slip can easily be introduced into the wafer especially at a temperature of 1000° C. or more.

In order to suppress such introduction of slip, it is necessary to reduce the amount of deflection of the wafer and distribute the self-weight stress effectively. As one of its methods, a susceptor for supporting a whole backside surface of the wafer may be used. However, this causes a problem that contact scratches caused by the susceptor are formed on the whole backside surface of the wafer. There may be an elevational difference of about 1 μm between these contact traces and it may locally deteriorate flatness of the front surface side of the wafer where a semiconductor device is formed. Thus, it is not preferred.

The present invention is made by considering the situations as described above, and aims to provide a silicon wafer capable of preventing the void defect present in the wafer bulk region from becoming a contamination source in the device process and further preventing the void defect from becoming a source of the slip generation.

Further, the present invention aims to provide a method for heat-treating a silicon wafer capable of greatly reducing the void defect in the outermost surface portion and the surface layer portion of the device active region in the case of using the rapid heating/cooling thermal process which is the heat treatment performed in the order of seconds.

Furthermore, the present invention aims to provide a method for heat-treating a silicon wafer capable of effectively suppressing introduction of slip and reducing crystal defects such as COP in the region near the wafer surface to be the device active region, even in the case of using the susceptor which supports the outer periphery of backside of the silicon wafer in a ring shape when subjecting the silicon wafer to the rapid heating/cooling thermal process.

Means to Solve the Problem

A silicon wafer in accordance with the present invention comprises a wafer surface region which is a defect-free region having no void defects, and a wafer bulk region which is deeper than the wafer surface region having the void defects in the shape of a polyhedron whose basic shape is an octahedron, in which a corner portion of the polyhedron is formed in a curved shape and an inner-wall oxide film of the void defect is removed.

By using such silicon wafer, it is possible to prevent the void defect present in the wafer bulk region from becoming a contamination source in a device process. Further, it is possible to prevent the void defect from becoming a source of slip generation.

The above described void defects are preferably a sphere or an ellipsoid in which all the corner portions of the above-mentioned polyhedron are formed in a curved shape.

By using such silicon wafer, it is possible to positively prevent the void defect present in the wafer bulk region from becoming a source of the slip generation.

Further, a method for heat-treating a silicon wafer in accordance with a first embodiment of the present invention is, a method for heat-treating a silicon wafer which performs a rapid heating/cooling thermal process on the silicon wafer produced by a CZ method and comprises supplying an inert gas into a first space on a front surface side of the silicon wafer where a semiconductor device is formed; supplying an oxidizing gas into a second space on a back surface side of the silicon wafer; and performing the process at a maximum achievable temperature of from 1300° C. to 1400° C.

An oxygen partial pressure in the above-mentioned oxidizing gas is preferably set to a range from 20% to 100%.

An oxide film formed on the back surface side of the silicon wafer after performing RTP preferably has a thickness of 15 nm or more.

Further, a heat-treating method in accordance with a second embodiment of the present invention is, a method for heat-treating a silicon wafer which performs a rapid heating/cooling thermal process on the silicon wafer produced by a CZ method and comprises a first step of rapidly heating the silicon wafer to a maximum achievable temperature; a second step of maintaining the maximum achievable temperature for a predetermined period of time; and a third step of rapidly cooling from the maximum achievable temperature, wherein at least the first step is performed under a condition where an inert gas is supplied into a first space on a front surface side of the silicon wafer where a semiconductor device is formed, an oxidizing gas is supplied into a second space on the back surface side of the silicon wafer, and an inner pressure of the second space is set to a negative pressure compared to an inner pressure of the first space. By applying such method, when subjecting the silicon wafer to RTP, it is possible to effectively suppress introduction of slip and reduce crystal defects such as COP in the region near the wafer surface to be a device active region even with using a susceptor which supports the outer periphery of the back surface side of the silicon wafer such that the supported portion is shaped like a ring.

The above-mentioned negative pressure is preferably −500 Pa or less. In such a negative pressure range, more significantly, it is possible to effectively suppress introduction of slip and reduce the crystal defects such as COP in the region near the wafer surface to be the device active region.

The above-mentioned first space and second space are preferably spatially connected.

By using the RTP apparatus having such a structure and performing RTP under the above-described conditions, it is possible to suppress introduction of slip more effectively.

Effect of the Invention

In accordance with the present invention, it is possible to provide a silicon wafer capable of preventing the void defect present in the wafer bulk region from becoming a contamination source and further preventing the void defect from becoming a source of slip generation in the device process.

Therefore, the silicon wafer in accordance with the present invention greatly contributes to enhancing the yield in the device process.

Further, by the method for heat-treating the silicon wafer in accordance with the first embodiment of the present invention, it is possible to greatly reduce the void defects in the outermost surface portion and the surface layer portion of the device active region even in the case of performing RTP which is a heat treatment in the order of seconds.

Therefore, the silicon wafer which is subjected to the heat treatment in accordance with the first embodiment of the present invention greatly contributes to enhancing the yield in the device process.

Further, by the method for heat-treating the silicon wafer in accordance with the second embodiment of the present invention, when subjecting the silicon wafer to RTP, it is possible to effectively suppress introduction of slip and reduce crystal defects such as COP in the region near the wafer surface to be the device active region even with using the susceptor which supports the outer periphery of the back surface side of the silicon wafer such that the supported portion is shaped like a ring.

BEST MODE FOR CARRYING OUT THE INVENTION

Hereinafter, the present invention will be explained in detail with reference to the accompanying drawings.

Figure 1:
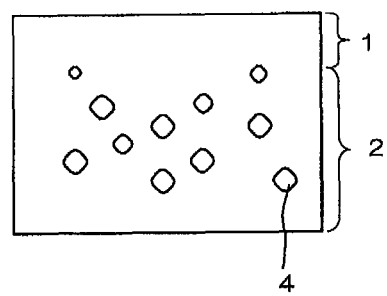
FIG. 1 is a schematic cross-sectional view illustrating one example of a silicon wafer in accordance with the present invention.

FIG. 1 is a schematic cross-sectional view illustrating one example of a silicon wafer according to the present invention.

As shown in FIG. 1, a silicon wafer in accordance with the present invention comprises a wafer surface region 1, to be more precise, a region from the wafer surface to a depth of 5 μm which is a defect-free region having no void defect. And the silicon wafer comprises a wafer bulk region 2 deeper than the wafer surface region 1, to be more precise, the wafer bulk region 2 is deeper than 5 μm from the wafer surface and includes a void defect 4 in the shape of a polyhedron whose basic shape is an octahedron in which a corner portion of the polyhedron is formed in a curved shape and an inner-wall oxide film of the void defect 4 is removed.

Figure 2:
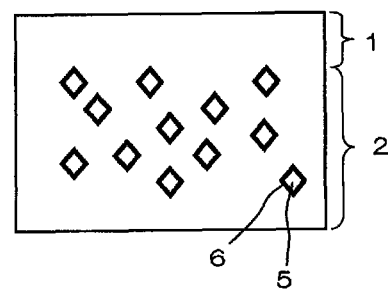
FIG. 2 is a schematic cross-sectional view illustrating a conventional silicon wafer.

By contrast, FIG. 2 is a schematic cross-sectional view illustrating a conventional silicon wafer.

The conventional wafer is obtained by slicing a silicon single crystal ingot grown by a CZ method so as to have a V-rich region and subjecting the thus-obtained silicon wafer to heat treatment so as to form a wafer surface region 1 as a defect-free layer. With respect to this conventional wafer, since oxygen in a wafer bulk region 2 is poorly out-diffused in the heat treatment, an inner-wall oxide film 6 of a void defect 5 present in the wafer bulk region 2 is not dissolved but remains.

Such inner-wall oxide film 6 has a characteristic of introducing metal impurities around the void defect 5. Therefore, in the case where there are many such void defects 5 in the wafer bulk region 2, there is a possibility that the void defect 5 itself becomes a contamination source in the device process.

For the silicon wafer in accordance with the present invention, since such inner-wall oxide film is removed, it is possible to prevent the void defect present in the wafer bulk region from becoming the contamination source in the device process.

Figure 6:
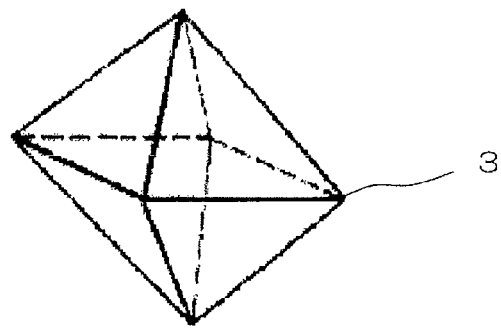
FIG. 6 is a perspective view showing a basic structure of a void defect.

Further, the void defect 4 as shown in FIG. 1 has the shape of a polyhedron whose basic shape is an octahedron and a corner portion thereof (reference character 3 in FIG. 6) is formed in a curved shape.

That is, since the sharp corner of the void defect 4 of the silicon wafer in accordance with the present invention is formed in a curved shape, it is possible to prevent the void defect 4 from becoming a source of slip generation.

Therefore, the silicon wafer in accordance with the present invention greatly contributes to enhancing the yield in the device process.

Figure 3:
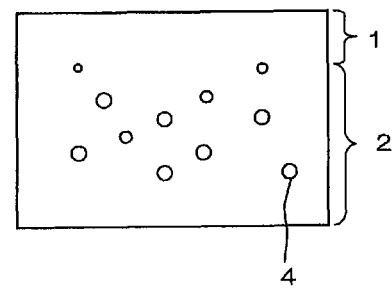
FIG. 3 is a schematic cross-sectional view illustrating another example of the silicon wafer in accordance with the present invention.

FIG. 3 is a schematic cross-sectional view illustrating another example of the silicon wafer in accordance with the present invention.

The above-mentioned void defect 4 is preferably a sphere or an ellipsoid in which all the corner portions of the above-mentioned polyhedron are formed in a curved shape as shown in FIG. 3.

Such silicon wafer can positively prevent the void defect present in the wafer bulk region from becoming a source of slip generation.

For such void defect 4 present in the wafer bulk region 2, by performing grinding and polishing from the wafer surface region 1 to the wafer bulk part 2, its shape can be evaluated by using a transmission electron microscope.

Next, a method for producing a silicon wafer and a method for heat-treating a silicon wafer in accordance with the present invention will be explained.

The above-described silicon wafer in accordance with the present invention can be produced by performing RTP on a silicon wafer obtained by slicing a silicon single crystal ingot produced by a CZ method.

Further, the method for heat-treating the silicon wafer in accordance with the present invention is to perform RTP on the silicon wafer produced by slicing the silicon single crystal ingot grown by the CZ method.

The CZ method is, as well-known, a method for growing the silicon single crystal ingot by heating polysilicon filled in a quartz crucible into a silicon melt solution, causing a seed crystal to come in contact with a liquid level of the silicon melt solution, pulling up the seed crystal while rotating the seed crystal and the quartz crucible, forming a straight body portion by increasing a diameter into a desirable diameter, and then cutting it off from the silicon melt solution.

At this time, the silicon single crystal ingot is grown so as to have a V-rich region by controlling V/G (V indicates a pulling rate and G indicates a temperature gradient).

Then, after the thus-obtained silicon single crystal ingot is sliced into a wafer by using an inner diameter slicing or wire saw or the like, a silicon wafer is obtained by performing a machining operation such as beveling of the outer periphery, lapping, etching and mirror polishing.

Figure 4:
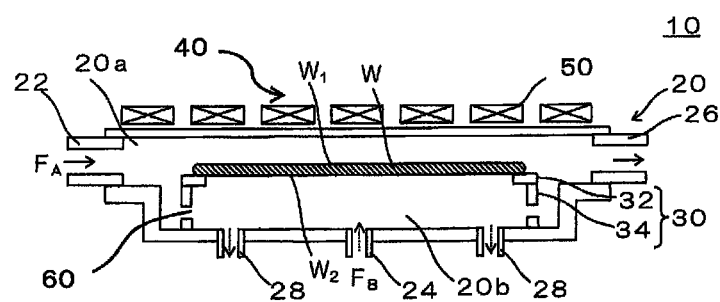
FIG. 4 is a cross-sectional view showing an outline of an RTP apparatus (chamber part) employed for obtaining the silicon wafer in accordance with the present invention and used in a method for heat-treating the silicon wafer in accordance with the present invention.

The above-mentioned RTP can preferably be performed on the thus-obtained mirror polished wafer for example by an RTP apparatus as shown in FIG. 4.

The RTP apparatus 10 shown in FIG. 4 includes a reaction tube 20 for housing a wafer W, a wafer support 30 disposed inside the reaction tube 20 for supporting the wafer W and a plurality of halogen lamps 50 for irradiating and heating the wafer W with light.

It is to be noted that in the state that the wafer W is supported on the wafer support 30, a first space 20a surrounded by an inner wall of the reaction tube 20 and a front surface W1 side of the wafer W where a semiconductor device is formed, and a second space 20b surrounded by the inner wall of the reaction tube 20 and a back surface W2 side of the wafer W are formed.

The above-mentioned reaction tube 20 includes a gas supply port 22 for supplying a first atmosphere gas $F_A$ (solid-line arrow in the drawing) into the first space 20a on the front surface W1 side of the wafer W where the semiconductor device is formed, a gas discharge port 26 for discharging the gas from the first space 20a, a gas supplying port 24 for supplying a second atmosphere gas $F_B$ (dashed-line arrow in the drawing) into the second space 20b on the back surface W2 side of the wafer W and a gas discharge port 28 for discharging the gas from the second space 20b. The reaction tube 20 is made of, for example, quartz.

The wafer support 30 includes a susceptor 32 for directly supporting the outer periphery of the back surface W2 side of the wafer W such that the supported portion is shaped like a ring and a rotation part 34 for supporting the susceptor 32 and rotating the susceptor 32 in the diameter direction. The susceptor 32 and the rotation part 34 are made of, for example, SiC.

A heating unit 40 is disposed above the wafer support 30 and outside the reaction tube 20, and heats the wafer W from the front surface W1 side. The heating unit 40 is constituted of, for example, a plurality of halogen lamps 50.

In addition, the first space 20a and the second space 20b formed within the reaction tube 20 are spatially connected each other by a connection part 60.

In the case of performing RTP by using the RTP apparatus 10 shown in FIG. 4, the wafer W is introduced into the reaction tube 20 from a wafer inlet (not illustrated) of the reaction tube 20 and supported on the susceptor 32 of the wafer support 30 such that the supported portion of the wafer W is shaped like a ring. Then, the first atmosphere gas $F_A$ which will be described later is introduced from the first supply port 22 and the second atmosphere gas $F_B$ which will be described later is introduced from the second supply port 24 respectively while heating the wafer W by the heating unit 40.

Hereinafter, one example of RTP for obtaining the silicon wafer in accordance with the present invention by using the RTP apparatus shown in FIG. 4 will be explained. One example of a heat treatment sequence in RTP is shown in FIG. 5.

Figure 5:
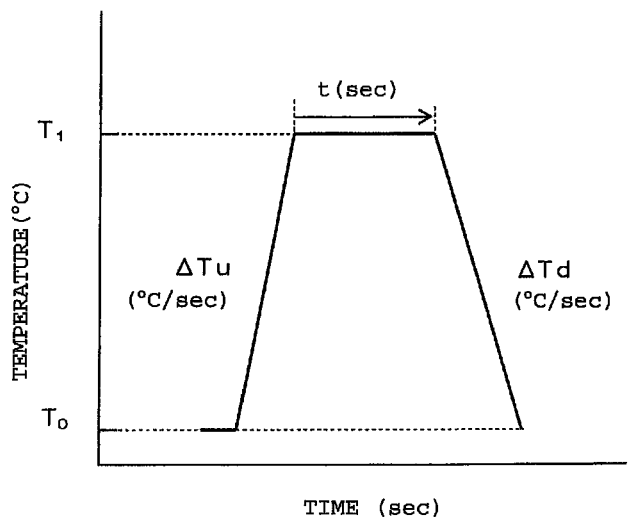
FIG. 5 is a conceptual graph for describing one example of a heat treatment sequence in RTP for obtaining the silicon wafer in accordance with the present invention and applied to the method for heat-treating the silicon wafer in accordance with the present invention.

In the heat treatment sequence shown in FIG. 5, firstly the outer periphery of the back surface W2 side of the wafer W is placed and supported on the susceptor 32 of the wafer support 30 inside the reaction tube 20 kept at a temperature of T0 (for example, 600° C.). Subsequently, the first atmosphere gas $F_A$ is supplied from the gas supply port 22 while discharging the first atmosphere gas $F_A$ from the gas discharge port 26 (if desired, the second atmosphere gas $F_B$ is supplied from the gas supply port 24 while discharging the second atmosphere gas $F_B$ from the gas discharge port 28), and the wafer W is irradiated with light from the halogen lamp 50 while rotating the susceptor 32 by the susceptor rotating part 34 so as to be rapidly heated to the maximum achievable temperature T1 (° C.) at a predetermined temperature rise rate ΔTu (° C./sec).

Next, the maximum achievable temperature T1 is maintained for a predetermined time t (sec).

Thereafter, the light irradiation from the halogen lamp 50 is turned off and the wafer W is rapidly cooled at a predetermined temperature drop rate ΔTd (° C./sec), if desired, by using the second atmosphere gas $F_B$.

The temperature of the wafer W in the above-described heat treatment sequence is measured, for example, by a radiation thermometer (not shown) disposed below the wafer W. Also, the temperature rise rate and the temperature drop rate are controlled using a control unit (not shown) based on the temperature measured as above by controlling the output of individual halogen lamps 50 and the flow rate of the first atmosphere gas $F_A$ or the second atmosphere gas $F_B$ or the like As a first method for obtaining the silicon wafer in accordance with the present invention, an oxygen concentration of the silicon single crystal ingot to be grown is preferably not more than $1.1 \times 10^{18}$ atoms/cm$^3$. In other words, the oxygen concentration of the wafer bulk region of the silicon wafer in accordance with the present invention is preferably not more than $1.1 \times 10^{18}$ atoms/cm$^3$.

By such method, an inner-wall oxide film of the void defect present in the wafer bulk region 2 becomes more soluble in RTP, and interstitial-Si (hereinafter be called "i-Si") generated in the wafer surface region 1 is diffused into the wafer bulk part 2 and enters the void defect where the inner-wall oxide film is removed. Thus, the silicon wafer shown in FIG. 1 including the void defect in the shape of a polyhedron whose basic shape is an octahedron in which the inner-wall oxide film thereof is removed and the corner portion of the polyhedron is formed in a curved shape, can be obtained.

The oxygen concentration as used herein means a value determined from a conversion factor of Old ASTM standards in 1970-1979 Edition, it can be evaluated by infrared spectroscopic analysis, or a secondary ion mass spectrometer (SIMS).

Further, in addition to the above-mentioned method, by increasing the predetermined time t (second) of the maximum achievable temperature T1, i-Si generated in the wafer surface region 1 is increased and many i-Si enter the void defects and fill the inside of the void defects in which the inner-wall oxide film thereof is removed furthermore. Thus, the silicon wafer as shown in FIG. 3 having minute void defects being a sphere or an ellipsoid in which all the corner portions are formed in a curved shape can be obtained.

The above-mentioned oxygen concentration is preferably not less than $0.8 \times 10^{18}$ atoms/cm$^3$ in order to suppress slip generation in RTP and maintain the strength of the wafer.

Further, as a second method for obtaining the silicon wafer in accordance with the present invention, an inert gas is preferably used as the first atmosphere gas $F_A$ and an oxidizing gas is preferably used as the second atmosphere gas $F_B$ in the heat treatment sequence of RTP for example shown in FIG. 5.

By this method, a large amount of i-Si is generated on the back surface W2 side and diffused to the front surface W1 side of the wafer, and dissolution of the inner-wall oxide film of the void defect present in the wafer bulk region 2 is enhanced by i-Si. Thus, the void defect in the shape of a polyhedron whose basic shape is an octahedron is shaped to approximate to a sphere which is energetically stable and i-Si fills the inside the void defect, thereby the silicon wafer as shown in FIG. 1 can be obtained.

Further, by increasing the predetermined time t (second) of the maximum achievable temperature T1, many i-Si generated on the back surface W2 side of the wafer are diffused into the wafer bulk region 2, enter the void defects in which the inner-wall oxygen film thereof is removed, and fill the inside the void defects having approximate to the sphere shape furthermore. Thus, the silicon wafer as shown in FIG. 3 having minute void defects being a sphere or an ellipsoid in which all the corner portions are formed in a curved shape can be obtained.

Still further, as a third method for obtaining the silicon wafer in accordance with the present invention, the oxidizing gas is preferably used as the first atmosphere gas $F_A$ and the second atmosphere gas $F_B$ in the heat treatment sequence of RTP for example shown in FIG. 5.

By this method, a large amount of i-Si is generated on the front and back surfaces of the silicon wafer and dissolution of the inner-wall oxide film of the void defect present in the wafer bulk region 2 is enhanced by i-Si. Thus, the void defect in the shape of a polyhedron whose basic shape is an octahedron is shaped to approximate to a sphere which is energetically stable and i-Si fills the inside the void defect, thereby the silicon wafer as shown in FIG. 1 can be obtained.

Further, by increasing the predetermined time t (second) of the maximum achievable temperature T1, many i-Si generated in the wafer front and back surfaces are diffused into the wafer bulk region 2, enter the void defects in which the inner-wall oxygen film is removed, and fill the inside the void defects having approximate to the sphere shape furthermore. Thus, a silicon wafer as shown in FIG. 3 having minute void defects being a sphere or an ellipsoid in which all the corner portions are formed in a curved shape can be obtained.

It is to be noted that when the third method is used, void defects may remain at the outermost surface portion of the silicon wafer (for example, within 1 μm from the wafer surface). In this case, the silicon wafer in accordance with the present invention as shown in FIGS. 1 and 3 can be obtained by polishing the surface of the silicon wafer after RTP.

The above-mentioned maximum achievable temperature T1 in RTP is preferably from 1300° C. to a melting point of silicon.

In the case where the above-mentioned maximum achievable temperature T1 is lower than 1300° C., it is difficult to enhance an ability of eliminating the void defects in the wafer surface region to be the device active region.

On the other hand, the maximum achievable temperature T1 exceeding the melting point of silicon is not preferred because the silicon wafer being subjected to the heat treatment is melted.

It is to be noted that upper limit of the above-mentioned maximum achievable temperature T1 is more preferably not higher than 1380° C. in terms of the durability of the RTP apparatus Further, the inert gas to be used in RTP is preferably argon gas and the oxidizing gas is preferably oxygen.

In the case of using a nitrogen gas as the inert gas, a nitride film is formed on the wafer surface in RTP, and an etching step or the like for removing the nitride film must be newly added, which is not preferred because of increase in the number of steps. Also, a hydrogen gas is not preferred because a mixed gas of oxygen to be used as the second atmosphere gas $F_B$ and hydrogen has a danger of explosion. Furthermore, an ammonia-based gas reduces the ability of eliminating the void defects in the wafer surface region and is not preferred.

A temperature rise rate ΔTu is preferably from 10° C./sec to 150° C./sec.

The above-mentioned temperature rise rate ΔTu lower than 10° C./sec results in poor productivity. Further, there is a problem that an area where oxygen is diffused into the inside of the substrate and reached to the saturation concentration is increased, therefore an area where elimination of the inner-wall oxide film is insufficient is increased. Thus, it is not preferred. On the other hand, in the case where the temperature rise rate ΔTu exceeds 150° C./sec, there is a problem that the silicon wafer cannot withstand the excessively rapid temperature change and a slip is generated on the silicon wafer.

In addition, the temperature drop rate ΔTd is preferably from 10° C./sec to 150° C./sec. There is a problem that the above-mentioned temperature drop rate ΔTd lower than 10° C./sec results in poor productivity, whereas in the case where it exceeds 150° C./sec, the silicon wafer cannot withstand the excessively rapid temperature change and the slip is generated on the silicon wafer.

Next, a heat treatment method in accordance with a first embodiment of the present invention will be explained. RTP applied to the heat treatment method in accordance with the first embodiment of the present invention is performed on a mirror-polished silicon wafer under the conditions such that using an RTP apparatus 10 as illustrated in FIG. 4, an inert gas is supplied as a first atmosphere gas $F_A$ into a first space 20a on a front surface W1 side of a silicon wafer where a semiconductor device is formed, an oxidizing gas is supplied as a second atmosphere gas $F_B$ into a second space 20b on the back surface W2 side of the silicon wafer, a maximum achievable temperature is set to a range from 1300° C. to 1400° C., for example in a heat treatment sequence as illustrated in FIG. 5.

More specifically, the mirror-polished wafer W is placed inside a reaction tube 20 kept at a temperature of T0 (for example, 600° C.). Subsequently, the inert gas is supplied into the first space 20a on the front surface W1 side of the wafer W where the semiconductor device is formed and the oxidizing gas is supplied into the second space 20b on the back surface W2 side of the wafer W. The temperature is rapidly heated from the temperature T0 (° C.) to the maximum achievable temperature T1 (° C.) which is from 1300° C. to 1400° C. at a predetermined temperature rise rate ΔTu (° C./sec). Thereafter, the maximum achievable temperature T1 (° C.) is maintained for a predetermined time t (sec) and rapidly cooled from the above-mentioned maximum achievable temperature T1 (° C.) to a temperature for removing the wafer W out of the reaction tube 20 (for example, temperature T0 (° C.)) at a predetermined temperature drop rate ΔTd (° C./sec).

It is to be noted that when using the RTP apparatus 10 as illustrated in FIG. 4, the above-described temperatures T0 and T1 can be measured by a radiation thermometer (not shown) disposed below the wafer support 30. In the case where a plurality of radiation thermometers are disposed in the diameter direction of the wafer W, it can be average temperature thereof.

Thus, by the method for heat-treating the silicon wafer in accordance with the first embodiment of the present invention having the above-described features, void defects can greatly be reduced in the outermost surface portion and surface layer portion of the device active region even in the case of using RTP which is a heat treatment performed in the order of seconds. Therefore, the silicon wafer being subjected to the heat treatment of the present invention can greatly contribute to enhancing the yield in the device process.

Next, a mechanism for obtaining the effect of the invention will be explained.

Figure 7:
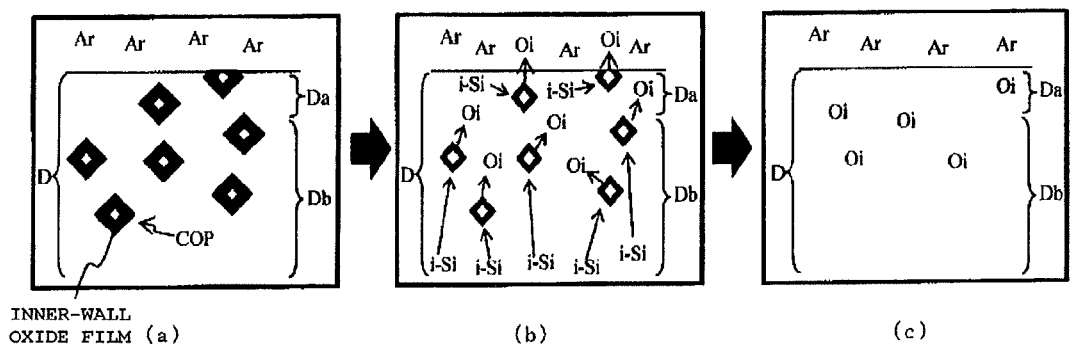
FIG. 7 is a cross-sectional view for describing a mechanism where the void defects are reduced by a first embodiment of the method for heat-treating the silicon wafer in accordance with the present invention.

FIG. 7 is a cross-sectional view of a wafer for describing a reduction mechanism of void defects by applying the method for heat-treating the silicon wafer in accordance with the first embodiment of the present invention.

In RTP of the present invention, the inert gas (argon in FIG. 7) is supplied to the front surface W1 side of the wafer and the oxidizing gas (not shown) is supplied to the back surface W2 side respectively (FIG. 7(a)). As a result, an inner-wall oxide film of void defects present in a device active region D is dissolved, and at an outermost surface portion Da of the device active region D, oxygen is diffused outwardly from the wafer surface. It is to be noted that a plurality of i-Si are generated on the back surface W2 side of the wafer by supplying the oxidizing gas to the back surface W2 side of the wafer. Since i-Si has a high diffusion rate within silicon, a plurality of i-Si are diffused from the back surface W2 side of the wafer to the front surface W1 side. In addition, on the front surface W1 side of the wafer, i-Si is also generated within the outermost surface portion Da by supplying the inert gas (FIG. 7(b)). Therefore, it is possible to greatly reduce the void defects present in the outermost surface portion Da by i-Si generated in the outermost surface portion Da, and greatly reduce the void defects present in a surface layer portion Db of the device active region D by i-Si diffused from the back surface W2 side of the wafer W respectively (FIG. 7(c)).

It is to be noted that in the case where the oxidizing gas is supplied to the front surface W1 side of the wafer, the inner-wall oxide film of the void defects becomes less soluble due to an increase in concentration of solid-solution oxygen in the outermost surface portion of the device active region. Thus, the void defects may remain without being eliminated.

Figure 8:
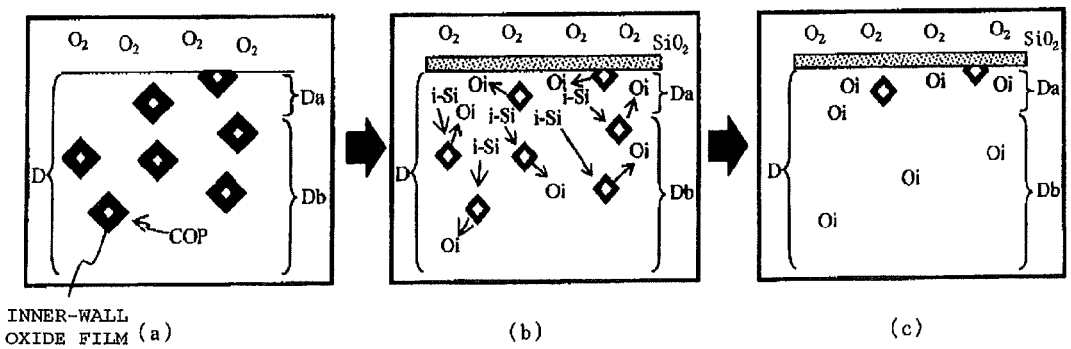
FIG. 8 is a cross-sectional view of the wafer for describing a mechanism where void defects remain in an outermost surface portion of a device active region in the case of supplying an oxidizing gas to a front surface W1 side of the wafer.

FIG. 8 is a cross-sectional view of the wafer for describing a mechanism where the void defects remain in the outermost surface portion of the device active region in the case of supplying the oxidizing gas to the front surface W1 side of the wafer.

In RTP, when the oxidizing gas (oxygen in FIG. 8) is supplied to the front surface W1 side of the wafer (FIG. 8(a)), because the oxygen in the atmosphere is in-diffused into the wafer, an oxide film ($SiO_2$) is formed on the wafer surface and the concentration of solid-solution oxygen in the outermost surface portion Da of the device active region D is increased. It is to be noted that although the inner-wall oxide film of the void defects present in the outermost surface portion Da may slightly be dissolved, it remains in the void defects without being dissolved fully. On the other hand, in the surface layer portion Db of the device active region D, the concentration of solid-solution oxygen is not increased by the oxygen in-diffusion, thus, the inner-wall oxide film of the void defects present in the surface layer portion Db is dissolved (FIG. 8(b)).

Therefore, in the outermost surface portion Da, i-Si generated by the in-diffusion of oxygen cannot enter the void defects because of the inner-wall oxide film remaining in the void defects. As a result, it is considered that the void defects remain in the outermost surface portion Da (FIG. 8(c)).

It is to be noted that if the oxidizing gas is not supplied to the back surface W2 side of the wafer, an atmosphere where a rare gas is supplied to the front surface W1 side of the wafer does not allow a sufficient amount of i-Si generated on the front surface W1 side of the wafer. For this reason, the void defects may be eliminated only in the outermost surface portion of the device active region by RTP which is short-time heat treatment performed in the order of seconds. In the surface layer portion which is underlying layer of the outermost surface portion, the ability of eliminating the void defects is reduced and the void defects may remain without being eliminated.

Figure 9:
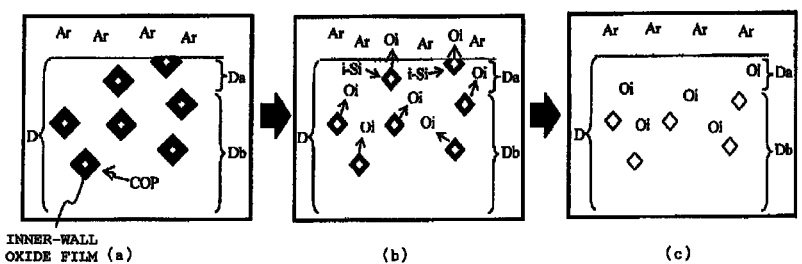
FIG. 9 is a cross-sectional view of the wafer for describing a mechanism where the void defects remain in a surface layer portion of the device active region in the case of not supplying the oxidizing gas to a back surface W2 side of the wafer.

FIG. 9 is a cross-sectional view of the wafer for describing a mechanism where the void defects remain in the surface layer portion of the device active region in the case where the oxidizing gas is not supplied to the back surface W2 side of the wafer.

In the case where the inert gas (argon in FIG. 9) is supplied to the front surface W1 side of the wafer and the oxidizing gas is not supplied to the back surface W2 side in RTP (FIG. 9(a)), the inner-wall oxide film of the void defects present in the device active region D is dissolved and oxygen is out-diffused from the wafer surface in the outermost surface portion Da of the wafer. However, because the oxidizing gas is not supplied to the back surface W2 side of the wafer, the amount of i-Si generated in the wafer is small and i-Si is generated only on the front surface W1 side of the wafer (FIG. 9(b)). Therefore, it is considered that although the void defects can be eliminated in the outermost surface portion Da, the void defects (including void defect in which the inner-wall oxide film is dissolved) remain in the surface layer portion Db without being eliminated because of the small amount of i-Si (FIG. 9(c)).

It is to be noted that in the case where the atmosphere gas to be supplied into the first space 20a is a hydrogen gas, a mixed gas of the oxidizing gas (for example, oxygen) to be supplied to the second space 20b and the hydrogen gas poses a risk of explosion. Thus, it is not preferred.

In addition, in the case where the atmosphere gas to be supplied into the first space 20a or the second space 20b is nitrogen, a nitride film is formed on the surface of the wafer W in RTP, and an etching step or the like for removing the nitride film must be newly added, which is not preferred because of increase in the number of production steps.

Argon is preferably used as the inert gas to be supplied into the first space 20a. And, oxygen is preferably used as the oxidizing gas to be supplied into the second space 20b.

The above-mentioned maximum achievable temperature T1 is from 1300° C. to 1400° C. The ability of eliminating the void defects in the device active region can be enhanced under such temperature condition.

The above-mentioned maximum achievable temperature T1 lower than 1300° C. is not preferred because the ability of eliminating the void defects in the device active region is reduced. The above-mentioned maximum achievable temperature T1 exceeding 1400° C. is not preferred because it becomes close to the melting point of silicon and thereby causing thermal deformation of the wafer and generation of slip or the like.

More preferably, the upper limit of the above-mentioned maximum achievable temperature is not higher than 1380° C. in terms of the durability of the RTP apparatus.

The above-mentioned oxidizing gas preferably has an oxygen partial pressure of from 20% to 100%. By setting such a condition of the oxygen partial pressure, many i-Si are generated in the wafer and therefore, the ability of eliminating the void defects in the surface layer portion of the device active region can be enhanced. It is to be noted that in the case where the above-mentioned oxygen partial pressure is less than 20%, it is difficult to enhance the ability of eliminating the void defects in the surface layer portion because only a small amount of i-Si is generated in the wafer.

The above-mentioned inert gas is preferably an oxygen-free 100% argon gas and the above-mentioned oxidizing gas is preferably a 100% oxygen gas. By employing such a composition, the void defects can greatly be reduced in the outermost surface portion and the surface layer portion of the device active region.

An oxide film formed on the back surface side of the silicon wafer after the above-described RTP preferably has a thickness of not less than 15 nm.

By employing such an oxide film thickness, many i-Si are generated in the wafer and the ability of eliminating the void defects in the outermost surface portion of the device active region can be enhanced.

The holding time (t) of the above-mentioned maximum achievable temperature T1 (° C.) is preferably from 1 to 15 seconds. By employing such a configuration, the void defects can greatly be reduced in the outermost surface portion and the surface layer portion of the device active region, therefore the productivity can greatly be improved. It is to be noted that in the case where the above-mentioned holding time (t) is less than 1 second, because of the short holding time (t), there is a possibility that void defects are not reduced in the device active region. Thus, it is not preferred.

Next, a heat treatment method of a silicon wafer in accordance with a second embodiment of the present invention will be explained.

In a heat treatment sequence in accordance with the heat treatment method of the second embodiment, a mirror-polished wafer W is placed inside a reaction tube 20 in an RTP apparatus 10 kept at a temperature of T0 (for example, 600° C.) such as illustrated in FIG. 4, a first atmosphere gas $F_A$ is supplied into a first space 20a on the front surface W1 side of the wafer W where a semiconductor device is formed, and a second atmosphere gas $F_B$ is supplied into a second space 20b on the back surface W2 side opposite to the above-mentioned front surface W1 side of the wafer W.

Next, temperature is rapidly heated from a temperature T0 (° C.) to a first temperature T1 (° C.) which is a maximum achievable temperature at a predetermined temperature rise rate $\Delta Tu$ (° C./sec) (first step), thereafter, kept at the above-mentioned first temperature T1 (° C.) for a predetermined time t (second) (second step), and finally, rapidly cooled from the above-mentioned first temperature T1 (° C.) to a second temperature (for example, temperature T0 (° C.)) at a predetermined temperature drop rate $\Delta Td$ (° C./sec) (third step). It is to be noted that when placing the wafer W in the reaction tube 20 of the RTP apparatus 10 as illustrated in FIG. 1, the temperatures T0 and T1 can be measured by a radiation thermometer (not shown) disposed below a wafer support 30 (In the case where a plurality of radiation thermometers are disposed in the diameter direction of the wafer W, it can be average temperature thereof).

In the heat treatment method of the silicon wafer in accordance with the second embodiment of the present invention, at least in the above-mentioned first step, an inert gas is supplied as the first atmosphere gas $F_A$ and an oxidizing gas is supplied as the second atmosphere gas $F_B$ respectively. In addition, in order to prevent the second atmosphere gas $F_B$ from flowing into the first space 20a, RTP is performed under a condition where an inner pressure of the second space 20b is set to a negative pressure (in other words, lower pressure) compared to an inner pressure of the first space 20a.

Figure 11:
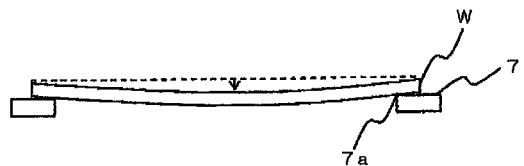
FIG. 11 is a cross-sectional view showing a wafer support for supporting the wafer in a conventional RTP apparatus.

The above-mentioned negative pressure can be adjusted by adjusting a discharge pressure set point of a second discharge port 28 relative to that of a first discharge port 26. By supplying the oxidizing gas as the second atmosphere gas $F_B$, it is possible to reduce the amount of deflection of the wafer as illustrated in FIG. 11 which can be a cause of slip generation as described above. In other words, by oxidizing the back surface W2 side of the wafer W and growing a thicker silicon oxide film on the back surface W2 side than the front surface W1 side while rapidly heating, it is possible to reduce the amount of deflection of the wafer by use of difference in the amount of thermal expansion between silicon and silicon oxide film. For example, at 1000° C., thermal expansion coefficient of the oxide film is smaller compared with that of silicon as the thermal expansion coefficient of the oxide film is $5.0 \times 10^{-7}$ (1/K) while that of silicon is $4.4 \times 10^{-6}$ (1/K). Thus, the amount of deflection of the wafer W can be reduced when the thicker oxide film is formed on the back surface W2 side of the wafer W.

In addition, by supplying the inert gas as the first atmosphere gas $F_A$ and setting the inner pressure of the second space 20b more negative than that of the first space 20a, it is possible to prevent the above-mentioned oxidizing gas from flowing into the first space 20a and reduce crystal defects such as COP in the region near the front surface W1 side of the wafer.

It is to be noted that in the case where the inner pressure of the second space 20b is not set to a negative pressure compared to the inner pressure of the first space 20a thereby allowing the oxidizing gas to flow into the first space 20a, thick oxide film is also formed on the front surface W1 side of the wafer W. In this case, because the thick oxide films are formed on the front and back surface sides of the wafer W, it is difficult to reduce the amount of deflection of the wafer by use of difference in the amount of thermal expansion between silicon and the silicon oxide film as described above. Further, when the thick oxide film is formed on the front surface W1 side of the wafer W, dissolution of an inner-wall oxide film of COP in the region near the wafer surface is inhibited. As a result, it becomes difficult to reduce the crystal defects such as COP in the region near the wafer surface.

It is to be noted that in the case where the first atmosphere gas $F_A$ is an oxidizing gas, thick oxide film is formed on the front surface W1 side of the wafer W. Thus, as described above, it is difficult to effectively suppress introduction of slip into the wafer W. In addition, it is difficult to reduce the crystal defects such as COP in the region near the wafer surface.

Further, in the case where a gas other than the oxidizing gas is used as the second atmosphere gas $F_B$, because oxide film is not formed on the back surface W2 side of the wafer W, it is difficult to suppress the introduction of slip effectively.

An argon gas is preferably used as the above-mentioned inert gas, and a 100% oxygen gas or a mixed gas of an oxygen gas and a helium gas is preferably used as the above-mentioned oxidizing gas.

It is preferred that the above-mentioned second space 20b is not substantially a closed space when holding the wafer W on the susceptor 32. In other words, in FIG. 4, it is preferred to include a connection part 60 for spatially connecting the first space 20a and the second space 20b. By using the RTP apparatus having such a structure and performing RTP under the condition as described above, it is possible to suppress the introduction of slip more effectively.

If the second space 20b of the RTP apparatus is a closed space while holding the wafer W, when RTP is performed under the condition where the inner pressure of the second space 20b is set to a negative pressure compared to that of the first space 20a as described above, stress is generated in the wafer W held on the susceptor 20 in the direction of the second space 20b having a lower pressure and the wafer W is more deflected. It results in an increase in the amount of deflection of the wafer W and it becomes difficult to effectively suppress the introduction of slip.

The above-mentioned negative pressure is preferably −500 Pa or less. That is, the inner pressure of the second space 20b is preferably set to a negative pressure which is −500 Pa or less compared to that of the first space 20a. As described above, this negative pressure is adjusted by adjusting the discharge pressure set point of the second discharge port 28 relative to that of the first discharge port 26 such that the discharge pressure set point of the second discharge port 28 is −500 Pa or less compared to that of the first discharge port 26. Such negative pressure range can more remarkably and effectively suppress the introduction of slip and reduce the crystal defects such as COP in the region near the wafer surface to be the device active region.

In the case where the above-mentioned negative pressure exceeds −500 Pa, because the oxidizing gas supplied into the second space 20b flows into the first space 20a, it becomes difficult to suppress the introduction of slip into the wafer W in RTP. In addition, it becomes difficult to reduce the crystal defects such as COP in the region near the wafer surface.

The above-mentioned negative pressure is preferably from −700 Pa to −500 Pa.

In the case where the above-mentioned negative pressure is lower than −700 Pa, it becomes difficult to supply the inert gas supplied into the first space 20a in the direction of the front surface W1 side of the wafer W, and results in a decrease in the effect of reducing the crystal defects such as COP in the region near the wafer surface. Thus, it is not preferred.

The above-mentioned temperature rise rate ΔTu is, for example, from 10° C./second to 150° C./second.

The above-mentioned first temperature T1 (° C.) is preferably from 1300° C. to a melting point of silicon. If the above-mentioned first temperature T1 (° C.) is lower than 1300° C., it results in a decrease in the effect of reducing the crystal defects such as COP in the region near the wafer surface. Thus, it is not preferred. The above-mentioned first temperature T1 (° C.) exceeding the melting point of silicon is not preferred because the wafer W is melted.

In addition, the above-mentioned first temperature T1 (° C.) is more preferably from 1300° C. to 1380° C. in terms of the durability of the RTP apparatus.

The holding time t for which the above-mentioned first temperature T1 (° C.) is held is, for example, from 1 to 60 seconds.

The above-mentioned temperature drop rate ΔTd is, for example, from 10° C./second to 150° C./second.

EXAMPLES

Hereinafter, the present invention will be explained in further detail with reference to the following examples, however, the present invention is not limited thereto.

Example 1

A silicon wafer (a diameter of 300 mm, a thickness of 775 μm and an oxygen concentration of $1.1\times10^{18}$ atoms/cm$^3$) obtained by slicing a silicon single crystal ingot grown by a CZ method so as to have a V-rich region was subjected to an RTP treatment by using an RTP apparatus as illustrated in FIG. 4. The RTP treatment was carried out by employing, a heat treatment sequence as shown in FIG. 5, using a 100% argon gas as a first atmosphere gas $F_A$ and using a 100% oxygen gas as a second atmosphere gas $F_B$, and setting a temperature rise rate ΔTu: 30° C./second, a maximum achievable temperature T1: 1350° C., a temperature drop rate ΔTd: 30° C./second and a holding time t of the maximum achievable temperature T1: 5 seconds.

Thereafter, presence or absence of void defects in the wafer surface region (from the wafer surface to a depth of 5 μm) was evaluated by a laser light scattering method, and after removing a surface layer by grinding and polishing, void defects in a wafer bulk region (a region deeper than 5 μm from the wafer surface) were observed by using a transmission electron microscope.

As a result, it was confirmed that the wafer surface region of thus-obtained silicon wafer was a defect-free region having no void defect, and the wafer bulk region included many void defects in the shape of a polyhedron whose basic shape was an octahedron in which a corner portion of the above-mentioned polyhedron was formed in a curved shape and inner-wall oxide films of the void defects were removed.

Example 2

Except for setting the holding time t of the maximum achievable temperature T1 as 15 seconds, a silicon wafer (a diameter of 300 mm, a thickness of 775 μm and an oxygen concentration of $1.1 \times 10^{18}$ atoms/cm$^3$) obtained by slicing a silicon single crystal ingot grown by the CZ method so as to have a V-rich region was subjected to the RTP treatment in the manner similar to that in Example 1.

Thereafter, presence or absence of void defects in the wafer surface region and void defects in the wafer bulk region were observed in the manner similar to that in Example 1.

As a result, it was confirmed that the wafer surface region of the thus-obtained silicon wafer was a defect-free region having no void defect, and the wafer bulk region included many void defects in the shape of a polyhedron whose basic shape was an octahedron. The void defects were a sphere or an ellipsoid in which all the corner portions of the above-mentioned polyhedron were formed in curved shape and inner-wall oxide films of the void defects were removed. In addition, the size of the void defects was smaller than that in Example 1.

Comparative Example 1

Except for using a 100% argon gas as the second atmosphere gas $F_B$, a silicon wafer (a diameter of 300 mm, a thickness of 775 μm and an oxygen concentration of $1.1 \times 10^{18}$ atoms/cm$^3$) obtained by slicing a silicon single crystal ingot grown by the CZ method so as to have a V-rich region was subjected to the RTP treatment in the manner similar to that in Example 1.

Thereafter, presence or absence of void defects in the wafer surface region and void defects in the wafer bulk region were observed in the manner similar to that in Example 1.

As a result, it was confirmed that the wafer surface region was a defect-free region having no void defect but the wafer bulk region included many void defects in which inner-wall oxide films thereof were not removed.

Example 3, Comparative Examples 2 to 6

A silicon single crystal ingot was grown by the CZ method so as to have a region where vacancy-type point defects were predominantly present while controlling v/G (v indicates a pulling rate and G indicates a temperature gradient in the pulling axis direction within the single crystal). Thereafter, a silicon wafer was sliced from a region where the vacancy-type point defects were predominantly present and mirror-polished on both surfaces. The thus-obtained silicon wafer (a diameter of 300 mm and a thickness of 775 μm) was subjected to the RTP treatment by using the RTP apparatus 10 as illustrated in FIG. 4. At this time, the RTP treatments were performed by varying the kind of the first atmosphere gas $F_A$ and the second atmosphere gas $F_B$, the maximum achievable temperature T1 and the holding time t (second) in the heat treatment sequence as shown in FIG. 5. It is to be noted that other conditions (fixed conditions) of this evaluation were as follows: temperature T0: 600° C., temperature rise rate ΔTu: 10° C./second and temperature drop rate ΔTd: 10° C./second.

With regard to the annealed wafer prepared under the above-described conditions, LPD (Light Point Defect) in the wafer surface where a device to be formed was measured by using Surfscan SP2 (40 nm) supplied by KLA-Tencor Corporation. In addition, LPD distribution in the depth-direction from the wafer surface was measured in a similar manner by repeatedly polishing the wafer surface where the device to be formed.

Further, with regard to the respective annealed wafers prepared under the respective conditions, LSTD (5 μm) in the wafer surface where the device to be formed was measured to calculate a decrease rate of a defect density. This measurement was carried out by using an LSTD (Laser Scattering Tomography Defect) scanner (MO-601, supplied by Raytex Corporation). Furthermore, for thickness of oxide film formed on the back surface side of the wafer, the center point of the front and back surfaces of the wafer was measured by an ellipsometric method by using a three-wavelength automatic ellipsometer Auto EL IV NIR III supplied by Rudolph Research Analytical.

Figure 10:
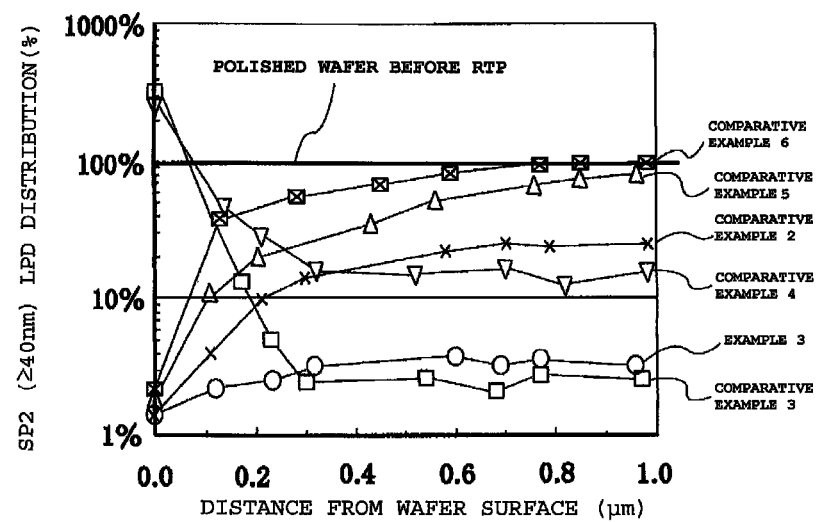
FIG. 10 is a graph showing measurement results of LPD in Example 3 and Comparative Examples 2 to 6.

The evaluation conditions of this evaluation and evaluation results of LSTD are shown in Table 1, and the measurement results of LPD in Example 3 and Comparative Examples 2 to 6 are shown in FIG. 10. The vertical axis in FIG. 10 shows the number of LPD (the number of void defects) when the number of LPD in a surface where the device is formed of a polished wafer before RTP measured by the SP2 is defined as 100%. The horizontal axis shows the distance from the wafer surface calculated from thickness of the center of the wafer measured by a capacitance method (AFS supplied by KLA-Tencor Corporation).

TABLE 1

| | First atmosphere gas $F_A$ | Second atmosphere gas $F_B$ | Maximum achievable temperature T1(° C.) | Holding time t (second) | LSTD (5 μm) decrease rate (%) |
|---|---|---|---|---|---|
| Example 3 | Ar | O$_2$ | 1350 | 15 | 98 |
| Comparative Example 2 | Ar | O$_2$ | 1250 | 30 | 85 |
| Comparative Example 3 | O$_2$ | — | 1350 | 15 | 89 |
| Comparative Example 4 | O$_2$ | — | 1250 | 30 | 70 |
| Comparative Example 5 | Ar | — | 1350 | 15 | 67 |
| Comparative Example 6 | Ar | — | 1250 | 30 | 28 |

As seen from Table 1 and FIG. 10, in the outermost surface portion and surface layer portion of the device active region of the annealed wafer obtained in Example 3, void defects were greatly reduced. In Comparative example 2 carried out at lower maximum achievable temperature T1 under the same atmosphere gas condition, void defects remained. Further, in both Comparative examples 3 and 4 carried out by using oxygen as the first atmosphere gas $F_A$, many void defects tended to remain in the outermost surface portion of the device active region. Still further, in Comparative examples 5 and 6 carried out by not using oxygen as the second atmosphere gas $F_B$, although the void defects were greatly reduced in the outermost surface portion of the device active region, in the surface layer portion which is deeper than the outermost surface portion, many void defects tended to remain.

Example 4, Comparative Examples 7 to 10

A silicon single crystal ingot was grown by the CZ method so as to have a region where vacancy-type point defects were predominantly present while controlling v/G (v indicates the pulling rate and G indicates the temperature gradient in the pulling axis direction within the single crystal). Thereafter, a silicon wafer was sliced from the region where the vacancy-type point defects were predominantly present and mirror-polished on both surfaces. The thus-obtained silicon wafer (a diameter of 300 mm and a thickness of 775 μm) was subjected to the RTP treatment by using the RTP apparatus 10 as illustrated in FIG. 4. At this time, the RTP treatment was performed in the heat treatment sequence as shown in FIG. 5 by varying the kind of the first atmosphere gas $F_A$ and the second atmosphere gas $F_B$, and varying a negative pressure (Pa) while adjusting an inner pressure of the second space 20b to a negative pressure compared to an inner pressure of the first space 20a. The negative pressure was adjusted by adjusting a discharge pressure set point of the second atmosphere gas discharge port 28 relative to that of the first atmosphere gas discharge port 26. In this evaluation, the above-mentioned varied kind of gas and varied condition of the negative pressure was maintained constant during all the steps in the heat treatment sequence as shown in FIG. 5. Other conditions of this evaluation were as follows: temperature T0: 600° C., temperature rise rate ΔTu: 50° C./second, first temperature T1: 1350° C., holding time t: 15 seconds and temperature drop rate ΔTd: 50° C./second.

Thickness of oxide film formed on the front and back surfaces of the annealed wafer obtained under the above-mentioned conditions was evaluated in the manner similar to that in Example 3. In addition, presence or absence of slip generation was evaluated by using X-ray topography (XRT 300) supplied by Rigaku Corporation. And, elimination of COP in the region near the wafer surface (a depth of from 0 to 5 μm) was evaluated. The COP was evaluated by using a LSTD scanner (MO-601 supplied by Raytex Corporation).

Examination conditions and evaluation results of Example 4 and Comparative examples 7 to 10 are shown in Table 2.

sphere gas $F_B$ and setting the discharge pressure set point to −500 Pa or less.

Examples 5 to 7, Comparative Example 11

Except for varying the above-mentioned discharge pressure set point (Pa), the RTP treatments were performed under the conditions similar to those in Example 4.

With regard to the annealed wafers obtained under the above-mentioned conditions, thickness of oxide film formed on the front and back surfaces, presence or absence of slip generation and elimination of COP were evaluated in the manner similar to that in Example 4.

Examination conditions and evaluation results in Examples 5 to 7 and Comparative example 11 are shown in Table 3.

TABLE 3

| | First atmosphere gas $F_A$ | Second atmosphere gas $F_B$ | Discharge pressure set point (Pa) | Thickness of Oxide film (Å) | | Slip generation | Elimination of COP in the region near the surface |
|---|---|---|---|---|---|---|---|
| | | | | Front surface W1 | Back surface W2 | | |
| Example 5 | Ar | $O_2$ | −500 | 10 | 240 | No | Eliminated |
| Example 6 | Ar | $O_2$ | −600 | 10 | 240 | No | Eliminated |
| Example 7 | Ar | $O_2$ | −700 | 5 | 240 | No | Eliminated |
| Comparative Example 11 | Ar | $O_2$ | −800 | 3 | 240 | No | Not eliminated |

As seen from Table 3, when the argon gas was used as the first atmosphere gas $F_A$, the oxygen gas was used as the second atmosphere gas $F_B$ and the discharge pressure set point exceeded −700 Pa, although slip was not generated, the COP in the region near the surface was not eliminated but remained.

Comparative Example 12

In the RTP apparatus 10 as illustrated in FIG. 4, except for sealing a connection part 60 and temporally closing the second space 20b, the RTP treatment was performed under the condition similar to those in Example 4. With regard to the annealed wafers obtained under the above-mentioned conditions, thickness of oxide film formed on the front and back surfaces, presence or absence of slip generation and elimina-

TABLE 2

| | First atmosphere gas $F_A$ | Second atmosphere gas $F_B$ | Discharge pressure set point (Pa) | Thickness of Oxide film (Å) | | Slip generation | Elimination of COP in the region near the surface |
|---|---|---|---|---|---|---|---|
| | | | | Front surface W1 | Back surface W2 | | |
| Example 4 | Ar | $O_2$ | −500 | 10 | 240 | No | Eliminated |
| Comparative Example 7 | Ar | Ar | −500 | 10 | 10 | Yes | Eliminated |
| Comparative Example 8 | $O_2$ | $O_2$ | −500 | 240 | 240 | Yes | Not eliminated |
| Comparative Example 9 | Ar | $O_2$ | −300 | 80 | 240 | Yes | Not eliminated |
| Comparative Example 10 | Ar | $O_2$ | −100 | 50 | 240 | Yes | Not eliminated |

As seen from Table 2, it was confirmed that slip was not generated and the COP in the region near the surface was effectively eliminated by using the argon gas as the first atmosphere gas $F_A$ and the oxygen gas as the second atmotion of COP were evaluated in the manner similar to that in Example 4.

Examination condition and evaluation result in Comparative example 12 are shown in Table 4.

TABLE 4

| | First atmosphere gas $F_A$ | Second atmosphere gas $F_B$ | Discharge pressure set point (Pa) | Thickness of Oxide film (Å) | | Slip generation | Elimination of COP in the region near the surface |
|---|---|---|---|---|---|---|---|
| | | | | Front surface W1 | Back surface W2 | | |
| Comparative Example 12 | Ar | $O_2$ | −500 | 10 | 240 | Yes | Eliminated |

As seen from Table 4, when the connection part 60 was sealed and the second space 20b was temporally closed in the RTP apparatus 10, although the COP in the region near the surface was eliminated, slip was generated.

Example 8, Comparative Examples 13 and 14

The kind of gas and condition of the negative pressure as indicated in Example 4 were applied only for the first step (Example 8), only for the second step (Comparative example 13) and only for the third step (Comparative example 14) in the heat treatment sequence shown in FIG. 5. In other respective steps, the condition of the negative pressure was maintained at −500 Pa and the second atmosphere gas $F_B$ was changed from oxygen to argon. Except for the above-mentioned conditions, the RTP treatments were performed under the conditions similar to those in Example 4.

With regard to the annealed wafers obtained under the above-mentioned conditions, thickness of oxide film formed on the front and back surfaces, presence or absence of slip generation and elimination of COP were evaluated in the manner similar to that in Example 4.

Examination conditions and evaluation results in Example 8 and Comparative examples 13 and 14 are shown in Table 5.

TABLE 5

| | First atmosphere gas $F_A$ | Second atmosphere gas $F_B$ | Step in heat treatment sequence in FIG. 5 | Thickness of Oxide film (Å) | | Slip generation | Elimination of COP in the region near the surface |
|---|---|---|---|---|---|---|---|
| | | | | Front surface W1 | Back surface W2 | | |
| Example 8 | Ar | $O_2$ | First step | 10 | 180 | No | Eliminated |
| Comparative Example 13 | Ar | $O_2$ | Second step | 10 | 230 | Yes | Eliminated |
| Comparative Example 14 | Ar | $O_2$ | Third step | 10 | 180 | Yes | Eliminated |

As seen from Table 5, by applying the kind of gas and the condition of the negative pressure as indicated in Example 4 at least in the first step, slip generation was prevented and the COP in region near the surface was eliminated. However, in the case of using argon as the second the atmosphere gas $F_B$ in the first step and the third step (Comparative example 13) or in the first step and second step (Comparative example 14), although the COP in the region near the surface was eliminated, slip was generated.

DESCRIPTION OF REFERENCE CHARACTERS 1 wafer surface region
2 wafer bulk region
4, 5 void defects
6 inner-wall oxide film
10 RTP apparatus
20 reaction tube
30 wafer support
32 susceptor
34 rotation part
40 heating unit
50 halogen lamp
60 connection part

The invention claimed is:

1. A method for heat-treating a silicon wafer which performs a rapid heating/cooling thermal process on the silicon wafer produced by a Czochralski method, the method comprising:
   supplying an inert gas into a first space only on a front surface side of said silicon wafer where a semiconductor device is formed;
   supplying an oxidizing gas into a second space only on a back surface side of said silicon wafer; and
   performing the process at a maximum achievable temperature of from 1300° C. to 1400° C. for 1-15 seconds.

2. The method as claimed in claim 1, wherein an oxygen partial pressure in said oxidizing gas is set to a range from 20% to 100%.

3. The method as claimed in claim 1, wherein an oxide film formed on the back surface side of said silicon wafer after performing said rapid heating/cooling thermal process has a thickness of 15 nm or more.

4. The method as claimed in claim 1, wherein the silicon wafer is cooled at 10 to 150° C./second.

* * * * *